United States Patent
Lee et al.

(10) Patent No.: US 8,829,678 B2
(45) Date of Patent: Sep. 9, 2014

(54) SEMICONDUCTOR PACKAGE AND METHOD FOR MANUFACTURING THE SAME

(71) Applicant: Amkor Technology, Inc., Chandler, AZ (US)

(72) Inventors: Jeong Seok Lee, Gwangju (KR); In Tae Kim, Gwangju (KR); Jae Sik Park, Gwangju (KR); Dai Hyun Jung, Gwangju (KR)

(73) Assignee: Amkor Technology, Inc.

( * ) Notice: Subject to any disclaimer, the term of this patent is extended or adjusted under 35 U.S.C. 154(b) by 64 days.

(21) Appl. No.: 13/739,547

(22) Filed: Jan. 11, 2013

(65) Prior Publication Data

US 2013/0328192 A1 Dec. 12, 2013

(30) Foreign Application Priority Data

Jun. 8, 2012 (KR) .......................... 10-2012-0061321

(51) Int. Cl.
*H01L 23/48* (2006.01)
*H01L 21/44* (2006.01)
*H01L 23/498* (2006.01)
*H01L 23/00* (2006.01)

(52) U.S. Cl.
CPC .......... *H01L 23/49816* (2013.01); *H01L 24/11* (2013.01)
USPC .................. 257/738; 257/737; 257/E23.021; 257/E23.069; 438/612; 438/614; 438/617

(58) Field of Classification Search
USPC .................. 257/737, 738, E23.021, E23.069; 438/612–617
See application file for complete search history.

(56) References Cited

U.S. PATENT DOCUMENTS

| | | | |
|---|---|---|---|
| 8,008,770 B2 * | 8/2011 | Lin et al. | 257/738 |
| 8,058,726 B1 * | 11/2011 | Jin et al. | 257/738 |
| 8,269,348 B2 * | 9/2012 | Fazelpour | 257/738 |

* cited by examiner

*Primary Examiner* — Jasmine Clark
(74) *Attorney, Agent, or Firm* — McAndrews, Held & Malloy, Ltd.

(57) ABSTRACT

One embodiment provides a semiconductor package by forming a redistribution layer extending from a bonding pad of a semiconductor chip using a photoresist pattern plated with the seed layer. Fabrication of the semiconductor package is relatively simple thereby shortening a manufacturing time and reducing the manufacturing cost, and which can increase an adhered area of input/output terminals and can prevent delamination by connecting and welding the input/output terminals to a pair of redistribution layers.

20 Claims, 7 Drawing Sheets

SEMICONDUCTOR PACKAGE AND METHOD FOR MANUFACTURING THE SAME

TECHNICAL FIELD

The present application relates to a semiconductor package and a method for manufacturing the same, and more particularly, to a semiconductor package having a new redistribution layer in a fine pitch, and a method for manufacturing the same.

BACKGROUND

In general, manufacturing of a wafer level semiconductor package of a chip scale includes integrating circuits, such as transistors, on a wafer state semiconductor chip, forming a passivation film on a surface of the semiconductor chip to protect the semiconductor chip from external impacts, and forming a redistribution layer (RDL) that is a conductive metal interconnection line.

FIGS. 6A to 6G are cross-sectional views sequentially illustrating process operations of a method for manufacturing a conventional semiconductor package. A process of forming a conventional redistribution layer will now be described with reference to FIGS. 6A to 6G.

Figure 6A:
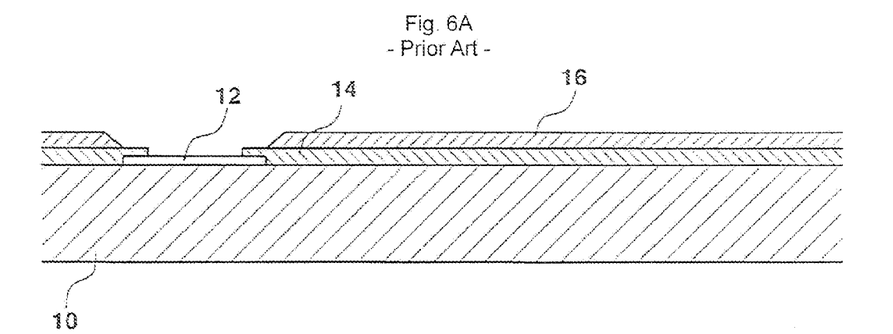
FIGS. 6A, 6B, 6C, 6D, 6E, 6F, 6G are cross-sectional views sequentially illustrating process operations of a method for manufacturing a conventional semiconductor package Common reference numerals are used throughout the drawings and the detailed description to indicate the same elements.

First, in an operation of providing a wafer, a designed circuit is integrated in a wafer-state semiconductor chip 10, and a bonding pad 12 is formed at a potential portion of an electrical input/output path of the circuit.

A die passivation 14 for protecting the integrated circuit is formed on the entire surface of the wafer-state semiconductor chip 10, and a first passivation film 16 is formed on the die passivation 14 (see FIG. 6A).

Here, a plurality of metal pads 12, sometimes called bonding pads 12, are formed on the semiconductor chip 10 in a predetermined array and exposed to the outside. Ends of a redistribution layer (RDL) 18 (FIG. 6C) are formed on the exposed bonding pads 12. The redistribution layer 18 includes metal interconnection lines for receiving a voltage for driving the circuit integrated in the semiconductor chip 10.

A seed layer 20 includes plating conductive lines for forming the redistribution layer 18. The seed layer 20 is formed throughout top surfaces of the first passivation film 16 and the bonding pad 12 by sputtering (see FIG. 6B).

Figure 6B:
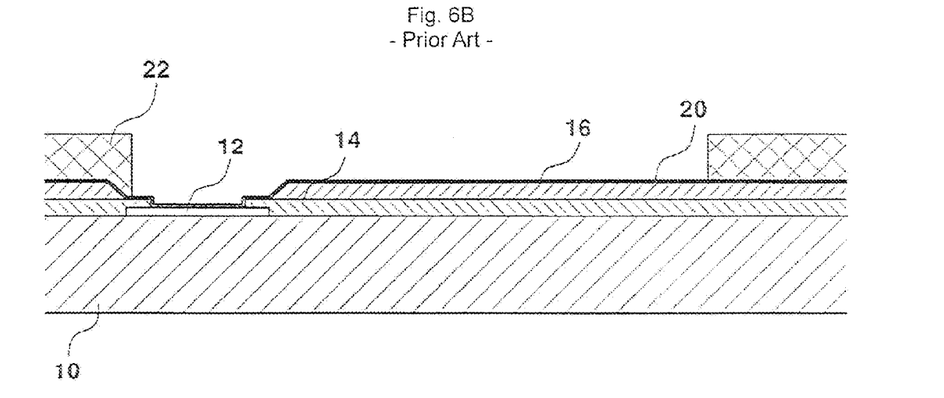
Figure 6C:
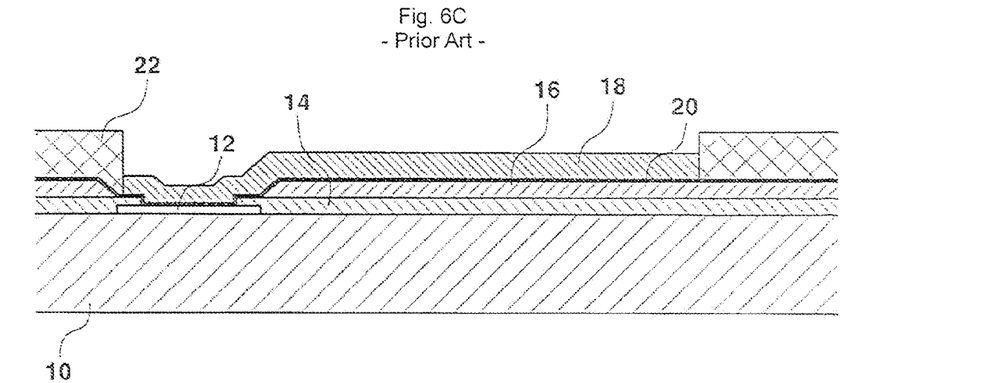
Figure 6D:
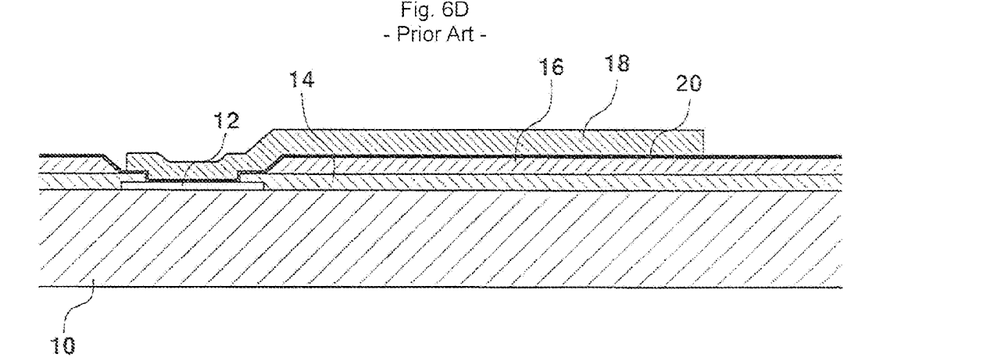
Figure 6E:
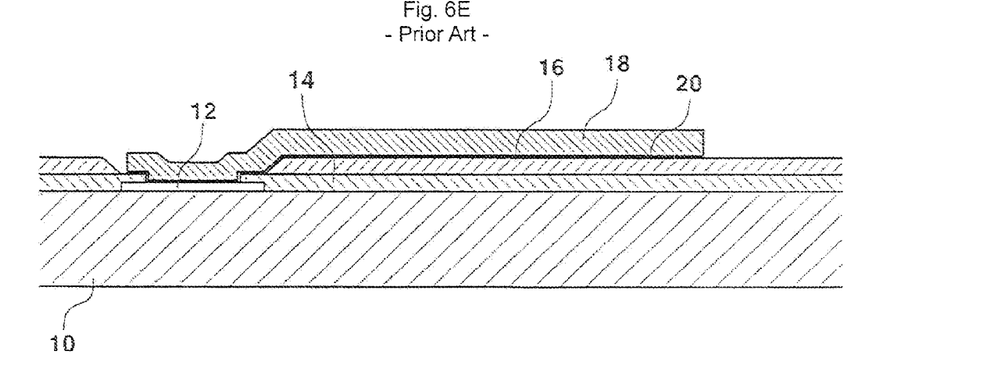
Figure 6F:
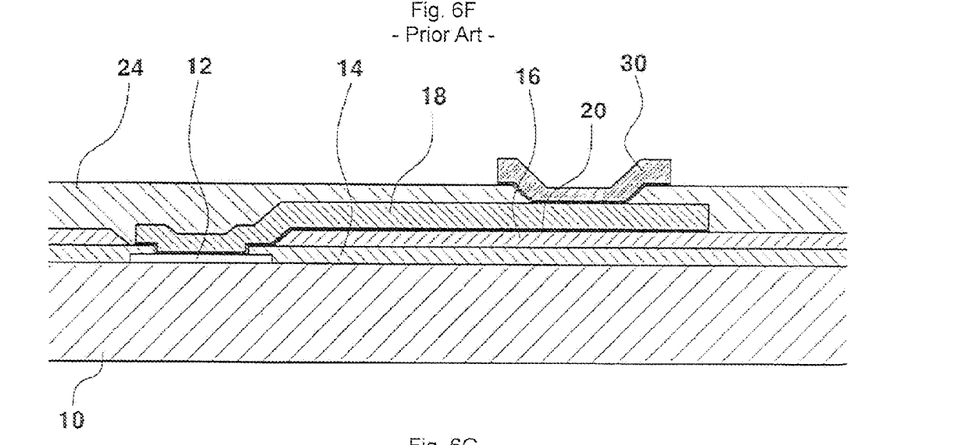
Figure 6G:
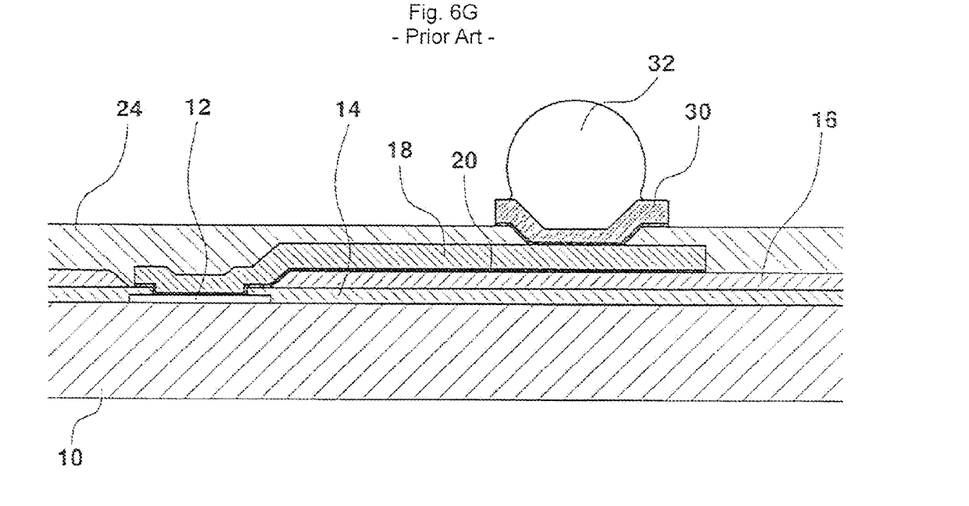

Subsequently, photoresist 22 is coated throughout the surface of the wafer state semiconductor chip 10, and general exposure and development operations are performed on the photoresist 22, thereby exposing potential portions of the bonding pad 12 and the seed layer 20 on the semiconductor chip 10 (see FIG. 6B).

Subsequently, an electroplating process for forming the redistribution layer 18 is performed on the bonding pad 12 of the exposed semiconductor chip 10 and a potential region of a redistribution layer. If current is allowed to flow through the seed layer 20 in a state in which the seed layer 20 is put into a solution containing metal ions, the redistribution layer 18 is formed on a surface of the seed layer 20, that is, on a surface of the seed layer 20 formed on the bonding pad 12 and a surface of the potential region of a redistribution layer (see FIG. 6C).

Next, the photoresist 22 is stripped for removal (see FIG. 6D), and the remaining seed layer 20, except for the seed layer 20 existing under the redistribution layer 18, is removed through an etching process (see FIG. 6E), thereby completing formation of the redistribution layer 18 having predetermined area and length.

Meanwhile, a second passivation film 24 for preventing external impacts, moisture or other foreign materials from being applied to the redistribution layer 18 and preventing an electrical short from occurring to neighboring redistribution layers 18 is formed while encapsulating the redistribution layer 18 throughout the surfaces of the first passivation film 16 and the redistribution layer 18. An under bump metal (UBM) 30 that is a metallic electrode terminal is formed by plating a seed layer (not shown) at the other end of the redistribution layer 18 (see FIG. 6F).

Thereafter, the input/output terminal 32, such as a solder ball, is finally welded onto the under bump metal 30 (see FIG. 6G), thereby completing the wafer level package.

However, since a large number of process operations and an extended manufacturing time are required, the manufacturing method of the conventional wafer level package is problematic.

That is to say, after a photoresist for forming a redistribution layer is subjected to patterning and exposure and alignment, it is necessary to perform etching operations for removing the photoresist and the seed layer. That is to say, quite many process operations and extended time are required, resulting in an increase in the manufacturing cost.

In addition, as the wafer level package is manufactured to have a very small size, which is substantially the same as the size of each semiconductor chip, the input/output terminal 32, such as a solder ball, welded onto the under bump metal 30 needs to be very small. Accordingly, an adhered area of the input/output terminal 32 is very small, suggesting that the input/output terminal 32 has a weak adhesion strength at its adhering boundary. Thus, the input/output terminal 32 is prone to delamination even by trivial impacts.

DETAILED DESCRIPTION

One embodiment features that a fine pitch redistribution layer can be formed just by sputtering without using separate removal operations of photoresist and a seed layer.

Referring to FIGS. 1A, 1B, 1C, 1D, 1E, cross-sectional views sequentially illustrating process operations of a method for manufacturing a semiconductor package according to an embodiment is illustrated.

Figure 1A:
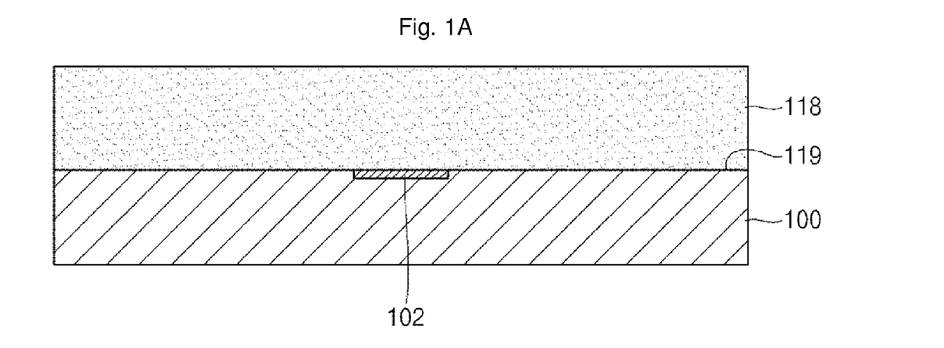
FIGS. 1A, 1B, 1C, 1D, 1E are cross-sectional views sequentially illustrating process operations of a method for manufacturing a semiconductor package according to an embodiment.

As illustrated in FIG. 1A, a photoresist 118 is first attached to an active surface 119 of a semiconductor chip 100 including a bonding pad 102 as an input/output path of an electrical signal.

Figure 1B:
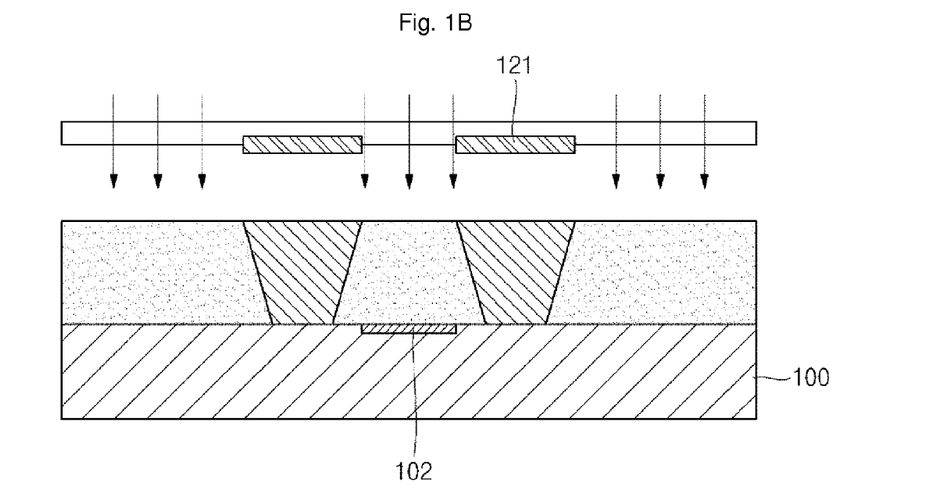

Next, referring to FIG. 1B, a patterning process is performed by covering a mask 121 on a potential region of a redistribution layer pattern in the entire area of the photoresist 118 and performing exposure and development operations on the other region of the photoresist 118.

Figure 1C:
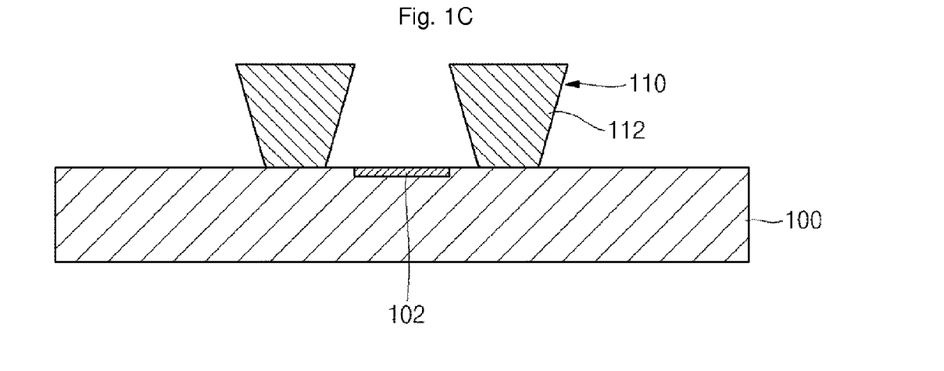

As the result of the patterning process, referring now to FIGS. 1B, 1C together, the region other than the potential region of the redistribution layer pattern is removed from the entire area of the photoresist 118, thereby forming a single unit redistribution layer pattern 110 extending from a portion around the bonding pad 102 of the semiconductor chip 100 to a predetermined position 131 (FIG. 2B) of the semiconductor chip 100.

Figure 1D:
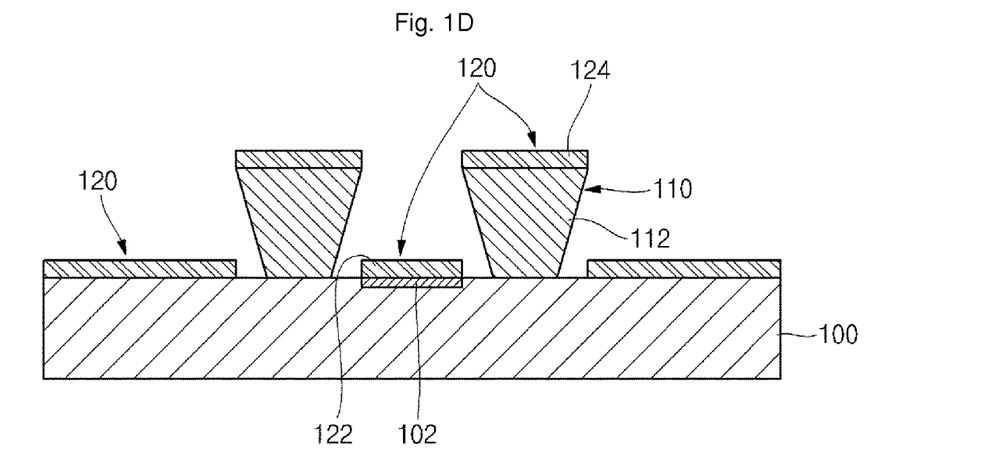
Figure 1E:
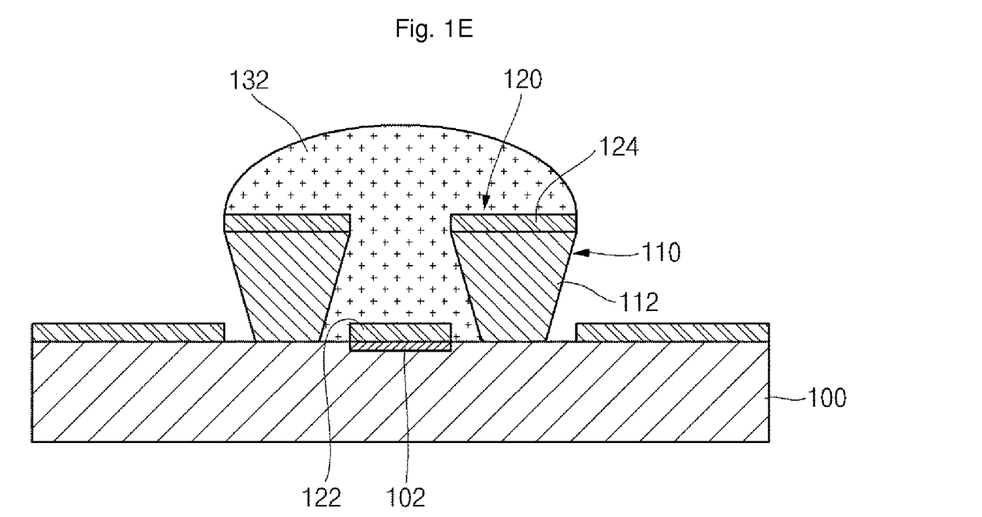
Figure 2A:
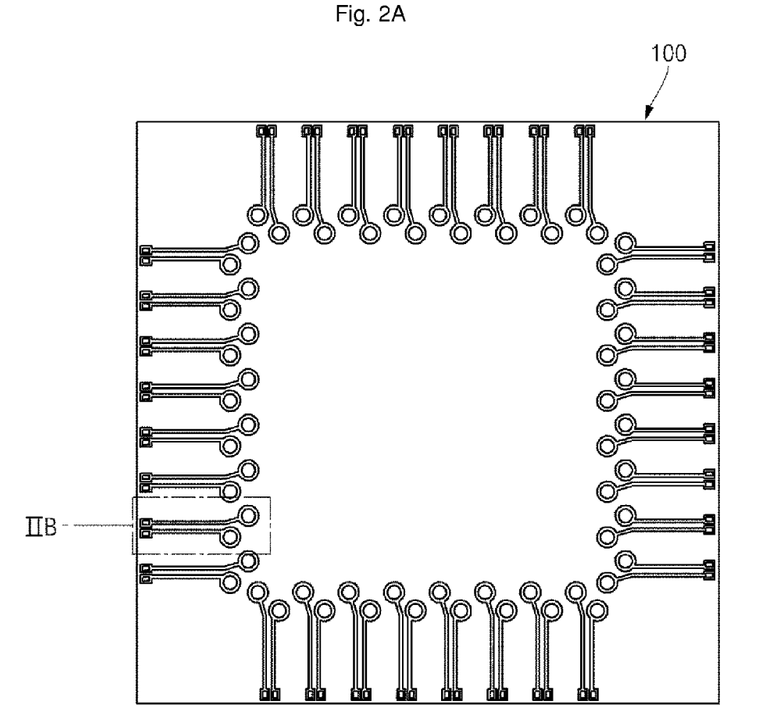
FIG. 2A is a schematic plan view illustrating a semiconductor package according to one embodiment.
Figure 2B:
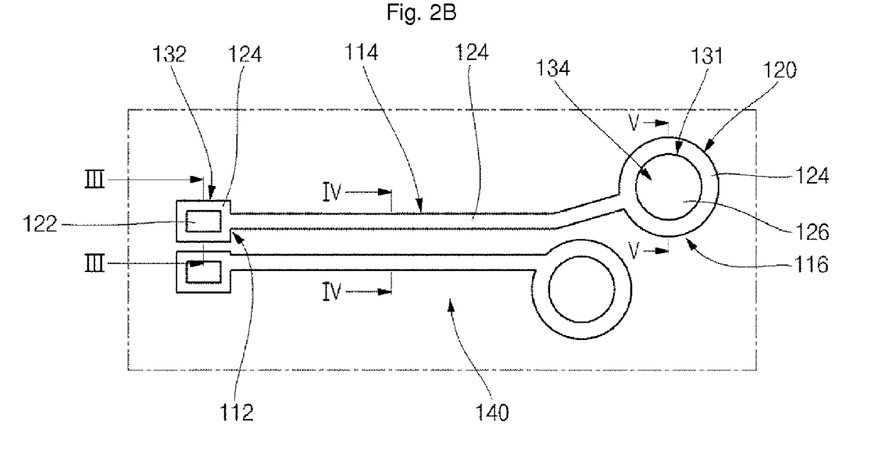
FIG. 2B is an enlarged plan view of the region IIB of the semiconductor package of FIG. 2A.
Figure 3:
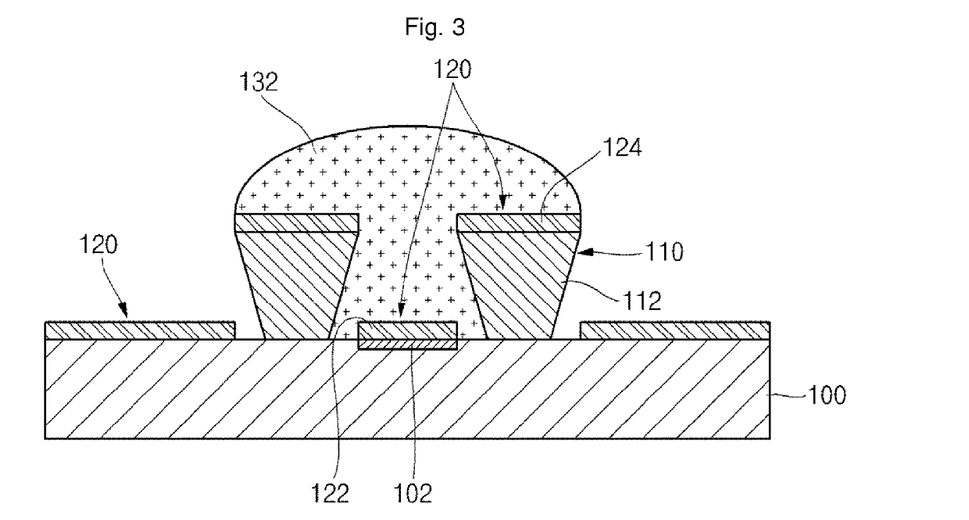
FIG. 3 is a cross-sectional view of the semiconductor package taken along the line III-III of FIG. 2B.
Figure 4:
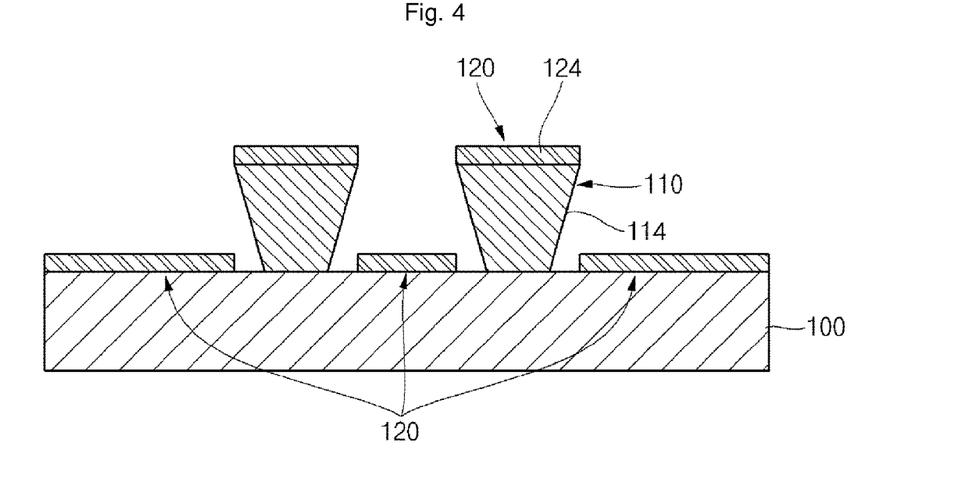
FIG. 4 is a cross-sectional view of the semiconductor package taken along the line IV-IV of FIG. 2B.
Figure 5:
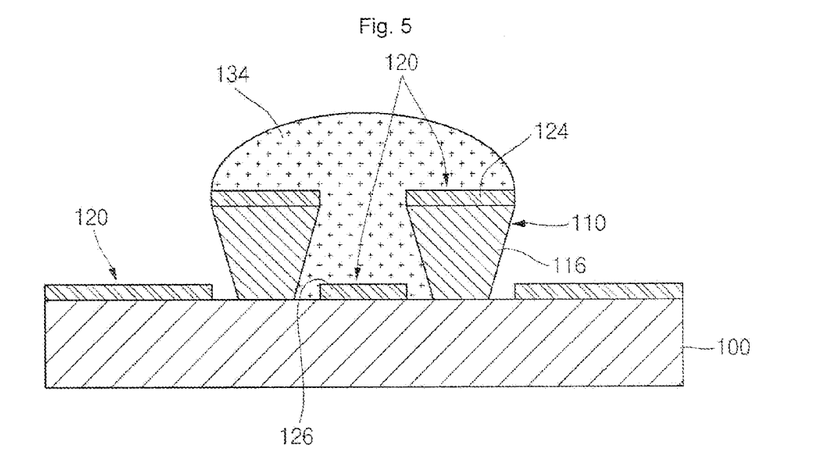
FIG. 5 is a cross-sectional view of the semiconductor package taken along the line V-V of FIG. 2B.

FIG. 2A is a schematic plan view illustrating the semiconductor package of FIGS. 1A-1E at a further stage of fabrication in according to one embodiment. FIG. 2B is an enlarged plan view of the region IIB of the semiconductor package of FIG. 2A. FIG. 3 is a cross-sectional view of the semiconductor package taken along the line III-III of FIG. 2B. FIG. 4 is a cross-sectional view of the semiconductor package taken along the line IV-IV of FIG. 2B. FIG. 5 is a cross-sectional view of the semiconductor package taken along the line V-V of FIG. 2B.

Referring now to FIGS. 1C, 2A, 2B, and 3 together, the redistribution layer pattern 110 includes a first ring type photoresist pattern 112 formed to protrude around the bonding pad 102 of the semiconductor chip 100.

Referring now to FIGS. 2A, 2B, and 4 together, the redistribution layer pattern 110 further includes a linear photoresist pattern 114 extending from the first ring type photoresist pattern 112 to a predetermined position 131 of the semiconductor chip 100.

Referring now to FIGS. 2A, 2B, and 5 together, the redistribution layer pattern 110 further includes a single unit second ring type photoresist pattern 116 formed at an end of the linear photoresist pattern 114.

Here, the first and second ring type photoresist patterns 112 and 116 are shaped of a circular, elliptic or rectangular ring. In particular, the first ring type photoresist pattern 112 is shaped of a circular ring surrounding the bonding pad 102 of the semiconductor chip 100.

In addition, the first and second ring type photoresist patterns 112 and 116 and the linear photoresist pattern 114 are simultaneously patterned by the exposure and development operations performed on the photoresist 118 attached to the semiconductor chip 100 to have the same height.

Next, referring to FIG. 1D, a seed layer 120 is formed, e.g., plated or sputtered, on the semiconductor chip 100 including the redistribution layer pattern 110 and any other features/layers formed thereon. More particularly, the seed layer 120 is formed on the bonding pad 102 of the semiconductor chip 100, the predetermined position 131 of the semiconductor chip 100, and the redistribution layer pattern 110, sometimes called a portion, connecting the bonding pad 102 of the semiconductor chip 100 to the predetermined position 131 of the semiconductor chip 100.

The seed layer 120 includes a first seed layer 122 plated on the bonding pad 102 of the semiconductor chip 100 and second and third seed layers 124 and 126. More particularly, the seed layer 120 includes three electrically isolated portions that are the first seed layer 122, the second seed layer 124, and the third seed layer 126.

In more detail, referring to FIGS. 1D, 2A, 2B, and 3 together, the first seed layer 122 is plated on the bonding pad 102 of the semiconductor chip 100 existing in an interior region of the first ring type photoresist pattern 112.

Referring to FIGS. 1D, 2A, 2B, 3, 4, and 5 together, the single unit second seed layer 124 is plated on the first and second ring type photoresist patterns 112 and 116 and the linear photoresist pattern 114.

Referring to FIGS. 2A, 2B, and 5 together, the third seed layer 126 is plated on the passivation film of the semiconductor chip 100 existing in an interior region of the second ring type photoresist pattern 116.

Here, since the first, second, and third seed layers 122, 124, and 126 are independently formed, i.e., physically separated from one another, they have not been conductively connected yet.

Accordingly, referring to FIGS. 1E, 2A, 2B, and 3 together, in order to conductively connect the first seed layer 122 to the second and third seed layers 124 and 126, the bonding pad 102 of the semiconductor chip 100 is conductively connected to the seed layer 120 plated on the predetermined position of the semiconductor chip 100 by the conductive connection member 132.

That is to say, the first seed layer 122 plated on the bonding pad 102 of the semiconductor chip 100 and the second seed layer 124 plated on the first ring type photoresist pattern 112 are enclosed within and conductively connected to each other by means of the first conductive connection member 130.

In addition, referring now to FIGS. 2A, 2B, and 5 together, the second seed layer 124 plated on the second ring type photoresist pattern 116 and the third seed layer 126 plated on the passivation film of the semiconductor chip 100 existing in the interior region of the second ring type photoresist pattern 116 are enclosed within and conductively connected to each other by means of the second conductive connection member 134.

In one embodiment, the second conductive connection member 134 forms an input/output terminal for the semiconductor package. The second conductive connection member 134 is connected and welded to both the second seed layer 124 and the third seed layer 126, sometimes called a pair of redistribution layers. This prevents delamination of the second conductive connection member 134. Delamination is further prevented by connecting and welding the second conductive connection member 134 to the third seed layer 126 thus increasing the adherence area, i.e., the area to which the second conductive connection member 134 is connected.

The first and second conductive connection members 132 and 134 may be solder paste or solder ball.

Therefore, the first seed layer 122 plated on the bonding pad 102 of the semiconductor chip 100 and the second seed layer 124 plated on the first ring type photoresist pattern 112 are conductively connected to each other by means of solder paste or solder ball, i.e., the first conductive connection member 132. The second seed layer 124 plated on the second ring type photoresist pattern 116 and the third seed layer 126 existing in an interior region of the second seed layer 124 are conductively connected to each other by means of solder paste or solder ball, i.e., the second conductive connection member 134, thereby completing the semiconductor package according to one embodiment.

As described above, a redistribution layer 140 is formed from the redistribution layer pattern 110 including the seed layers 122, 124, 126 and the conductive connection members 132, 134. Since the redistribution layer 140 extending from the bonding pad 102 of the semiconductor chip 100 to the predetermined position 131 of the semiconductor chip 100 is configured by a redistribution layer pattern 110 of a photoresist 118 and a seed layer plated 120 thereon, removal operations of the redistribution layer pattern 110 and the seed layer 120 can be obviated, unlike the conventional redistribution layer, a manufacturing time can be shortened and the manufacturing cost can be reduced.

Meanwhile, an output signal of the semiconductor chip 100 may be output to a mother board of an electronic product sequentially passing by the bonding pad 102, the first seed layer 122, the first conductive connection member 132, the second seed layer 124 and the second conductive connection member 134.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A semiconductor package comprising:
  a semiconductor chip;
  a redistribution layer pattern comprising:
    a first ring type photoresist pattern around a bonding pad of the semiconductor chip;
    a linear photoresist pattern extending from the first ring type photoresist pattern; and
    a second ring type photoresist pattern formed at an end of the linear photoresist pattern;
  a seed layer comprising:
    a first seed layer coupled to the bonding pad of the semiconductor chip;
    a second seed layer coupled to the redistribution layer pattern; and
    a third seed layer coupled to a passivation film of the semiconductor chip existing in an interior region of the second ring type photoresist pattern;
  a first conductive connection member coupling the first seed layer to the second seed layer; and
  a second conductive connection member coupling the second seed layer to the third seed layer.

2. The semiconductor package of claim 1, wherein a shape of the first and second ring type photoresist patterns is selected from a shape consisting of a circular, elliptic and rectangular ring.

3. The semiconductor package of claim 1, wherein the first and second conductive connection members comprise solder paste.

4. The semiconductor package of claim 1, wherein the first and second conductive connection members comprise a solder ball.

5. The semiconductor package of claim 1, wherein the first and second ring type photoresist patterns and the linear photoresist pattern are formed to have the same height.

6. A method for manufacturing a semiconductor package comprising:
  patterning a photoresist to form a redistribution layer pattern comprising:
    a first ring type photoresist pattern around a bonding pad of a semiconductor chip;
    a second ring type photoresist pattern;
    a linear photoresist pattern extending from the first ring type photoresist pattern to the second ring type photoresist pattern;
  forming a seed layer comprising:
    a first seed layer coupled to the bonding pad of the semiconductor chip;
    a second seed layer coupled to the redistribution layer pattern; and
    a third seed layer coupled to a passivation film of the semiconductor chip within an interior region of the second ring type photoresist pattern.

7. The method of claim 6 wherein the first seed layer is electrically isolated from the second seed layer.

8. The method of claim 7 wherein the second seed layer is electrically isolated from the third seed layer.

9. The method of claim 6 wherein the first seed layer, the second seed layer, and the third seed layer are physically separated from one another.

10. The method of claim 9 further comprising:
  coupling the first seed layer to the second seed layer with a first conductive connection member.

11. The method of claim 10 further comprising:
  coupling the second seed layer to the third seed layer with a second connection member.

12. The method of claim 11 wherein the second connection member forms an input/output terminal for the semiconductor package.

13. A method for manufacturing a semiconductor package comprising:
  coating a surface of a semiconductor chip with a photoresist;
  performing exposure and development operations on the photoresist to form a redistribution layer pattern extending from a bonding pad of the semiconductor chip to a predetermined position of the semiconductor chip;
  forming a seed layer coupled to the bonding pad of the semiconductor chip, the predetermined position of the semiconductor chip, and the redistribution layer pattern; and
  conductively connecting the seed layer on the bonding pad of the semiconductor chip to the seed layer on the predetermined position of the semiconductor chip by conductive connection members.

14. The method of claim 13, wherein the redistribution layer pattern comprises a first ring type photoresist pattern protruding around the bonding pad of the semiconductor chip.

15. The method of claim 14, wherein the redistribution layer pattern further comprises a linear photoresist pattern extending from the first ring type photoresist pattern to the predetermined position of the semiconductor chip.

16. The method of claim 15, wherein the redistribution layer pattern further comprises a second ring type photoresist pattern formed at an end of the linear photoresist pattern.

17. The method of claim 13, wherein the seed layer comprises a first seed layer coupled to the bonding pad of the semiconductor chip.

18. The method of claim 17, wherein the seed layer further comprises a second seed layer coupled to the redistribution layer pattern.

19. The method of claim 18, wherein the seed layer further comprises a third seed layer coupled to a passivation film of the semiconductor chip existing in an interior region of a ring type photoresist pattern of the redistribution layer pattern.

20. The method of claim 19, wherein the first seed layer is conductively connecting to the second seed layer by a first conductive connection member of the conductive connection members, and the second seed layer is conductively connected to the third seed layer by a second conductive connection member of the conductive connection members.

\* \* \* \* \*